United States Patent
Appell

(10) Patent No.: US 11,249,718 B2
(45) Date of Patent: Feb. 15, 2022

(54) SYSTEM FOR OUTPUTTING AUDIO SIGNALS AND RESPECTIVE METHOD AND SETTING DEVICE

(71) Applicant: Fraunhofer-Gesellschaft zur Foerderung der angewandten Forschung e.V., Munich (DE)

(72) Inventor: Jens Ekkehart Appell, Brake (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 0 days.

(21) Appl. No.: 15/994,466

(22) Filed: May 31, 2018

(65) Prior Publication Data
US 2018/0275955 A1 Sep. 27, 2018

Related U.S. Application Data

(63) Continuation of application No. PCT/EP2016/077902, filed on Nov. 16, 2016.

(30) Foreign Application Priority Data

Dec. 1, 2015 (DE) ...................... 10 2015 223 935.7

(51) Int. Cl.
*G06F 3/16* (2006.01)
*G06F 16/635* (2019.01)
(Continued)

(52) U.S. Cl.
CPC ............ *G06F 3/165* (2013.01); *G06F 16/635* (2019.01); *G06F 16/686* (2019.01); *H03G 5/165* (2013.01);
(Continued)

(58) Field of Classification Search
CPC ...... G06F 3/165; G06F 16/635; G06F 16/686; H04S 7/30; H04S 7/307; H04S 7/308;
(Continued)

(56) References Cited

U.S. PATENT DOCUMENTS 6,304,817 B1 10/2001 Troedel
6,792,092 B1 9/2004 Michalewicz
(Continued)

FOREIGN PATENT DOCUMENTS

DE 102011076484 A1 11/2012
EP 1035530 A2 9/2000
(Continued)

OTHER PUBLICATIONS

Zaini, Norliza et al., "Online personalized audio therapy recommender based on community ratings", IEEE Symposium on Computer Applications and Industrial Electronics (ISCAIE); Dec. 3, 2012; pp. 318-322; XP032345815, Dec. 3, 2012, 318-322.

*Primary Examiner* — Andrew C Flanders
(74) *Attorney, Agent, or Firm* — Perkins Coie LLP; Michael A. Glenn

(57) ABSTRACT

What is described is a system for outputting audio signals having a first output device for outputting audio signals having predeterminable parameter values of a first set of settable parameters, a data storage for storing parameter values, and an administration device. Thus, the administration device accesses the data storage and searches for stored parameter values for a set of parameters which is equal or similar to the first set of parameters. In addition, in case of having found stored parameter values, the administration device transfers the parameter values and/or parameter values determined therefrom to the first output device.

10 Claims, 3 Drawing Sheets

(51) Int. Cl.
   *H04S 7/00* (2006.01)
   *G06F 16/68* (2019.01)
   *H03G 5/16* (2006.01)
   *H03G 3/30* (2006.01)

(52) U.S. Cl.
   CPC ............. *H04S 7/30* (2013.01); *H04S 7/307* (2013.01); *H03G 3/3005* (2013.01); *H04R 2225/41* (2013.01)

(58) Field of Classification Search
   CPC .. H03G 5/165; H03G 3/3005; H04R 2225/41; H04R 3/00; H04R 3/12; H04R 5/04
   See application file for complete search history.

(56) References Cited

U.S. PATENT DOCUMENTS

| | | | |
|---|---|---|---|
| 9,445,169 B2 | 9/2016 | Appell et al. | |
| 2005/0240395 A1* | 10/2005 | Wiser | G11B 20/10527 704/201 |
| 2006/0123080 A1* | 6/2006 | Baudino | H04L 67/306 709/204 |
| 2006/0123081 A1* | 6/2006 | Baudino | G06Q 30/02 709/204 |
| 2007/0064954 A1* | 3/2007 | Booth | H04R 5/04 381/58 |
| 2008/0133544 A1* | 6/2008 | Fujimoto | H04N 21/4126 |
| 2008/0175411 A1* | 7/2008 | Greve | G10H 1/0041 381/103 |
| 2009/0047993 A1* | 2/2009 | Vasa | G11B 27/105 455/556.1 |
| 2009/0164473 A1* | 6/2009 | Bauer | G11B 27/034 |
| 2009/0290725 A1* | 11/2009 | Huang | H03G 5/165 381/103 |
| 2010/0076577 A1* | 3/2010 | Lee | G10L 19/008 700/94 |
| 2010/0162117 A1 | 6/2010 | Basso et al. | |
| 2011/0040395 A1* | 2/2011 | Kraemer | G10L 19/00 700/94 |
| 2012/0057078 A1* | 3/2012 | Fincham | H04N 5/57 348/645 |
| 2014/0003623 A1* | 1/2014 | Lang | H03G 3/3089 381/98 |
| 2014/0031962 A1 | 1/2014 | Akatsu | |
| 2014/0079243 A1 | 3/2014 | Appell et al. | |
| 2014/0112484 A1* | 4/2014 | Britt, Jr. | H04R 29/001 381/59 |
| 2014/0161285 A1* | 6/2014 | Oh | G10L 19/008 381/107 |
| 2014/0248036 A1* | 9/2014 | Saari | H04N 9/8205 386/248 |
| 2014/0301567 A1 | 10/2014 | Kim | |
| 2014/0369519 A1 | 12/2014 | Leschka et al. | |
| 2015/0193195 A1* | 7/2015 | Lin | H04R 1/1091 700/94 |
| 2016/0259619 A1* | 9/2016 | Appell | G06F 3/165 |

FOREIGN PATENT DOCUMENTS

| | | |
|---|---|---|
| JP | 2014026146 A | 2/2014 |
| JP | 2014093577 A | 5/2014 |
| JP | 2014519274 A | 8/2014 |
| JP | 2014534658 A | 12/2014 |
| JP | 2015513836 A | 5/2015 |

\* cited by examiner

SYSTEM FOR OUTPUTTING AUDIO SIGNALS AND RESPECTIVE METHOD AND SETTING DEVICE

CROSS-REFERENCE TO RELATED APPLICATIONS

This application is a continuation of copending International Application No. PCT/EP2016/077902, filed Nov. 16, 2016, which is incorporated herein by reference in its entirety, and additionally claims priority from German Application No. 10 2015 223 935.7, filed Dec. 1, 2015, which is also incorporated herein by reference in its entirety.

BACKGROUND OF THE INVENTION

The present invention relates to a system for outputting audio signals. In addition, the invention relates to a method for outputting audio signals using an output device and to a setting device for setting parameter values for outputting audio signals.

When reproducing audio signals, both music and speech, there is a strong dependence on preferences of the respective user or listener relative to the desired sound, like relative to frequency response, dynamic behavior or defaults for signal enhancement methods. Setting the parameters settable for reproduction thus takes place individually, wherein hearing problems maybe present are also to be taken into consideration.

At the same time, the specific listener nowadays has a plurality of output devices as terminal devices (like loudspeaker systems, TV, radio, computer, mobile phones, landline phone, car radio, etc.), software programs (so-called apps, like for listening to music, podcasts or for video conferences) and a plurality of application scenarios (like listening to music or spoken texts, telephoning or taking part in video conferences or chat systems) at his or her disposal which each exhibit different settable parameters or each use different parameter values.

The optimum setting of the parameters has to be set for an optimum listening experience for each application or terminal device or for each combination of terminal device and application. The complexity involved for the user is enormous. At the same time, the complexity of providing corresponding user interfaces for setting the parameters, on the part of the manufacturer of the application or terminal device, entails an additional complexity and additional costs so that realizing the ways of setting actually entailed is omitted.

This complexity or the lack of ways of setting entailed has the result that the user does not perform or is not able to perform any individualization, or only an incomplete one, so that he or she will experience poor sound or speech comprehension will suffer or a higher listening effort is entailed.

In order to reduce the complexity or as a consequence of the missing intention for individualization or simply for cost reasons, only very simplified ways of setting the sound (like only volume or only treble/bass control) are implemented in many apparatuses or applications.

All in all, the potential of modern audio signal processing, like relative to an adaptation to the listening environment or hearing loss in the listener, is not fully exploited.

Consequently, the object underlying the present invention is making individualization of audio signal outputs easier and, thus, more comfortable for the listener.

SUMMARY

According to an embodiment, a system for outputting audio signals may have: a first output device for outputting audio signals, wherein the first output device is configured to output audio signals having predeterminable parameter values of a first set of settable parameters, at least one data storage for storing parameter values, and at least one administration device, wherein the administration device is configured to access the data storage, wherein the administration device is configured to search the data storage for stored parameter values for a set of parameters which equals the first set of parameters or is similar to the first set of parameters, wherein the administration device is configured to take into consideration, when searching the data storage for the stored parameter values for the set of parameters, a user associated to the first output device by the administration device favoring stored parameter values for sets of parameters which are associated to users having preferences similar to the user, and wherein the administration device is configured such that, in case the administration device has found stored parameter values for the set of parameters in the data storage, the administration device transfers the stored parameter values for the set of parameters and/or parameter values determined therefrom to the first output device.

Another embodiment may have a method for outputting audio signals having predeterminable parameter values of a set of settable parameters using an output device, wherein a data storage is searched for a set of stored parameter values for a set of parameters which is equal or similar to a set of settable parameters of the output device, wherein when searching a user associated to the output device is taken into consideration by favoring the parameter values for sets of parameters which are associated to users having preferences similar to the user, wherein, in case parameter values for the set of parameters have been found, the parameter values and/or parameter values determined therefrom are transferred to the output device, and wherein the audio signals are output using the output device while applying the transferred parameter values.

The system comprises a first output device for outputting audio signals, at least one data storage for storing parameter values, and at least one administration device. Thus, the first output device is configured to output audio signals having predeterminable parameter values of a first set of settable parameters. Additionally, the administration device is configured to access the data storage. Additionally, the administration device is configured to search the data storage for stored parameter values for a set of parameters which equals the first set of parameters or is similar to the first set of parameters. Searching here refers to searching the data storage which, in some implementations, is done using specific criteria or by a restriction to parts of the data stored. Finally, the administration device is configured such that, in case the administration device has found stored parameter values for the set of parameters in the data storage, the administration device transfers the stored parameter values for the set of parameters to the first output device and/or transfers parameter values determined from the stored parameter values to the first output device. The settable parameters may, for example, be the volume, setting of treble or bass or special setting of individual frequency bands, characteristic lines for modifying the dynamic range, the degree of applying signal rendering algorithms etc. The settable parameters may, for example, also be values using which the filter function of an equalizer can be determined and set. Determining particularly refers to calculating parameter values, like by means of forming a mean value, by means of extrapolation or interpolation, spline forming or change in sample rate, etc. This may, for example, also entail complex parameters and preferences, like hearing loss of a listener/user, which are then used for determining settings, like the parameters of frequency-dependent dynamics compression.

In the inventive system, a (first, wherein an alternative term is current) output device is used—as a terminal device—for actually outputting the audio signals. For outputting, the output device comprises several settable parameters, the parameter values of which can be predetermined and which all together form a (first) set of parameters.

Additionally, a data storage where parameter values may be stored is provided. Advantageously, the respective combination of sets of parameters and respective parameter values will be stored.

Additionally, an administration device is provided, which accesses the data storage and searches for a set of parameters present, i.e. stored, which either equals the set of parameters of the (first or current) output device or is similar to this set. When such a matching set of parameters has been found, the administration device will transfer the parameter values belonging to the respective set to the (first) output device. Alternatively or additionally, the administration device transfers parameter values determined or derived from the stored parameter values to the first/current output device. This means that other parameters are generated from the parameter values associated to the set of parameters found and stored, and transmitted to the output device. The parameter values transferred—stored before or determined—are then used by the (first) output device for outputting the audio signals.

The invention will be discussed below using a practical example—while at the same time discussing exemplary implementations:

The user or listener sets the parameters of an output device such that the result will be a sound pattern optimum for him or her. The respective parameter values are stored in the data storage. When the listener wants to have audio signals output via the output device again at a later point in time, the administration device searches the data storage for the relevant set of parameters and transfers the respective parameter values to the output device which will then reproduce the audio signals, using these parameter values, in an optimum manner for the listener—i.e. with the parameter values set by him or her. When the output device for which the listener has predetermined the optimum setting, and the output device using which he or she currently wants to listen to the audio signals, are different, but similar devices, the data storage will also contain only a similar set of parameters. In this case, the administration device will transfer parameter values to the current output device which the administration device has determined from the parameter values stored. When determining, for identical parameter, the respective parameter values will, for example, be transferred. With different parameters, the respective parameter values will, for example, be determined starting from other parameters or parameter values thereof. This exemplarily takes place by means of extrapolation, forming a mean value or an estimation starting from other parameter values.

In one implementation, the system comprises an interface for detecting the parameter settings made from an output device. Additionally, information on the situation of the environment, i.e. on the contexts where audio signal outputting takes place, and/or on the respective user can be detected using the interface. The user here may also consist of a group of individuals. The information here may exhibit a certain degree of abstraction (like the audiogram of a listener) or be specific values.

In one implementation, the relevant information are detected offline and only transferred to the administration device or the data storage at a later point in time.

In another implementation, there is an interface which allows transmitting the parameter values to the current or first output device. In one implementation, the information are offline and, thus, transmitted before actually outputting the audio signals.

Expressed differently: the predetermined—historic—parameter values for outputting using an output device (in the present application exemplarily referred to as second output device) are used for—advantageously automatically—setting the parameter values of the audio signal output using a currently concerned output device (which here generally is referred to as first output device).

All in all, the system boasts the big advantage for the user or listener that he or she does not have to set the parameters specifically for all the output devices, but that the system can do this starting from the data sets present. Thus, not only the output devices or terminal devices where the user has already performed setting will be taken into consideration, but also those where no user-related setting has been performed so far. Consequently, either direct outputting of the parameter values stored or outputting the parameter values determined or derived.

Another advantage is that setting the parameters and applying the parameter values are separate so that the parameter values set are available at any time and using any applications and so that automatically determining parameter values, like by calculations, becomes possible.

One advantage for the manufacturers of output devices, i.e. terminal devices, may be to omit special interfaces for setting the apparatuses since the preferences or settings are administered centrally.

The following implementation relates to storing the parameter values in the data storage which the administration device can access later on.

Thus, the system additionally comprises a second output device for outputting audio signals—which in one implementation particularly is present only temporarily. The second output device is configured to output audio signals having predeterminable parameter values of a second set of settable parameters. Additionally, the administration device is configured to store, after predetermining the parameter values of the second set of parameters, at least the set parameter values in the data storage. After predetermining the parameter values of the second set of parameters, the predeterminable parameter values of the second set of settable parameters are set to set parameters. The second (an alternative term would be: historic) output device is part of the system, in particular before the first (current) output device, and serves the user or listener for setting the parameters which influence the audio signals output. When the settings have been performed, i.e. the user has predetermined the parameter values for the second output device, the administration device stores the parameter values for further usage in the first output device. Predetermining parameter values particularly means that a user of the second output device performs settings on the output device so that the result is a sound structure optimum for him or her.

In one implementation, the first output device and the second output device are different output devices which, in one implementation, at least belong to the same type of output devices and, in an alternative implementation, are different types. The type of output device in one implementation refers to the very apparatuses, i.e. whether it is a computer, a stereo set or, for example, a smartphone. In a different implementation, the type is the same basic type, but different versions or classes. In another implementation, the first output device and the second output device are equal, wherein, for example, the identical output device is connected to the system twice. In a last implementation, the system allows remembering the parameter values.

Depending on the implementation, the stored parameter values of the second output device relate to same, similar or different sets of parameters relative to the set of parameters of the first output device.

Alternatively or additionally, the parameter values are stored in the data storage directly—and with no detour of setting at an output device. This is exemplarily done by an interface which allows directly inputting parameter values of the parameters settable in an output device.

In one implementation, it is provided for the administration device to be configured such that it reads—for example directly from the current or first output device—which parameters are to be set in the first output device. The administration device consequently obtains information on the first set of parameter values to be filled with parameter values.

For further processing of the parameter values or finding the data sets, one implementation provides for the administration device to be configured to store the parameter values set in the data storage in a way associated to a type of the second output device and/or a user and/or an environmental situation and/or the audio signals to be output and/or a type of the audio signals to be output. In one variation, the type of output device is correspondingly also stored for the parameter values which in one implementation are set in the second output device. The type exemplarily relates to the respective parameters or the ways of setting the parameters or also the type of application.

Alternatively or additionally, the parameter values are stored as belonging to a respective user or an environmental situation. The environmental situation or listening situation here is that environment where the audio signals are reproduced. Reference here is made to the expositions of DE 10 2011 076 484 A1. The environmental situation exemplarily has an effect on the respective volume.

Additionally or alternatively, the parameter values are stored in dependence on a type or kind of the audio signals. Thus, the audio signals are exemplarily stored as speech signals or music signals, as classical, jazz or pop music signals, movie signals etc. or may be at first classified by an input by the user or by evaluating the audio signals. The type of audio signals may also be a mixed one or may be predetermined by the type of application or terminal devices. Thus, the audio signals transmitted by means of telephones will usually be speech signals. This further classification allows further precisely setting the listening preferences which may consequently also take into consideration the respective signals and the characteristics thereof.

The association of parameter values to the types of output devices, individual users or also respective environmental conditions allows correspondingly evaluating or further processing the parameter values. This particularly serves for the case where parameter values have not been stored in the data storage for all the parameters which are currently used for the respective application or the respective output device.

In one implementation, the administration device is configured to take into consideration, when searching the data storage for parameter values stored for the set of parameters, a user associated to the first output device. The user here is a listener who has logged in, for example, or who wants to use the output device for outputting the audio signals at this moment. Considering here means that the administration device will favor such stored parameter values for sets of parameters which are associated to the user or users having preferences similar to the user. The preferences here relate to the user and the other users belonging to a same group of listeners (like friends of classical or rock music). Alternatively, the preferences relate to similarities in the settings, like favoring the bass range, or different frequency bands. The preferences here may be similar, up to equal. The similarity may be that deviations are within a predeterminable deviation band.

In an implementation accompanying the previous implementation or, maybe, also alternative implementation, it is provided for the administration device to be configured to take into consideration, when searching the data storage for the stored parameter values for the set of parameters, a user associated to the first output device by the administration device to compare stored parameter values for sets of parameters associated to the user, but different types of output devices, to stores parameter values for sets of parameters associated to other users and these types of output devices, and to select stored parameter values for the set of parameters from the data storage which are associated to a user, for which the comparison results in the greatest similarity. This means that other types of output devices are also considered here, meaning that the general preferences only become obvious by comparing the parameter values for different output devices in the users or the user. The reference to a specific listener here entails the data stored in the data storage to also be associated to the individual users. In one implementation, it is provided for the current user to log in at the administration device with his or her current output device.

In one implementation, it is provided for the administration device to be configured to take into consideration, when searching the data storage for stored parameter values for the set of parameters, a current environmental situation at the first output device by the administration device favoring stored parameter values for sets of parameters associated to environmental situations similar to the current environmental situation. The preference here means that the associated data or parameter values receive higher a priority when searching. In particular, those parameter values which relate to the same or similar environmental situations will be favored. This may, for example, be a car drive, reproduction in a closed or open space, signal reproduction in an empty or filled space, speech reproduction on a platform when trains are arriving, etc.

In an alternative or additional implementation, it is provided for the administration device to be configured to take into consideration, when searching the data storage for stored parameter values for the set of parameters, the audio signals to be output by the administration device favoring stored parameter values for sets of parameters associated to audio signals similar to the audio signals to be output. In this implementation, those parameter values which refer to similar signal types or signal kinds will be favored. These may, for example, be speech signals in contrast to music signals or radio play signals in contrast to telephone calls, etc. In this implementation, the fact that the audio signals themselves may also influence the respective listening preferences is also taken into consideration. Thus, in speech signals, for example, different frequency ranges will be amplified than in music.

In addition, one implementation provides for the administration device to be configured such that, in case the data storage lacks a parameter value for the first set of parameters, the administration device determines at least the missing parameter value using the parameter values stored in the data storage. This implementation refers to the case where the first set of parameters of the first output device comprises at least one parameter which the data stored does not have a parameter value for, i.e. which is missing. For this case, the administration device will generate the missing parameter value by determining the missing parameter value from the parameter values present. This exemplarily takes place by generating a mean value from the parameter values present or performing extrapolation or interpolation.

Depending on the situation, several parameter values may be missing, or it may even be the case that there is no correspondingly matching set present in the data storage for a complete set of parameters. In case a set of parameters is completely missing, one implementation provides for the administration device to output a notification. This may, for example, be the case for a situation where no set of parameters or only an approximately comparable set is present. Alternatively, in the case of a completely missing set of parameters, the parameters values are determined from stored parameter values.

In a subsequent implementation, the administration device is configured to advantageously take into consideration the parameter values associated to a user and stored in the data storage when determining the missing parameter value.

In one implementation, for determining the missing parameter value or missing parameter values or even all the parameter values for a complete set of parameters, only the parameter values associated to a user will be used. The audio signals here are output for the user via the first/current output device. In this implementation, the special preferences of a user in the form of stored parameter values will be favored or, in particular, be used only for determining the missing parameter values. For this implementation, it is consequently of advantages for the respective user to be stored in relation to the parameter values. Furthermore, a way of how the user can make himself or herself known in the system or administration device may be realized.

For the following implementation, it is particularly the case that there is no set of parameters present in the data storage, which equals the first set of parameters of the first output device.

The implementation provides for the administration device to be configured to adapt, in case the administration device has found in the data storage a set of parameters which is similar to the first set of parameters, the respective and stored parameter values to the first set of parameters and transfer the adapted parameter values to the first output device. The administration device adapts the parameter values of the set of parameters which is similar to the set of parameters of the first output device such that they fit the first set of parameters (currently used for the audio signal output) in order to be used by the first output device for outputting the audio signals. Parameter values of similar parameters are, for example, accepted.

In the next implementation, the parameter values associated to a user are bundled to form an abstract overall structure. Thus, in one implementation, the administration device is configured to form a user profile for the user starting from the parameter values associated to a user and stored in the data storage. A user profile describes the preferences of the respective user on an abstract level irrespective of the output devices or environmental conditions in order to be able to determine missing parameter values more easily, for example. Determining the user profile exemplarily takes place using methods for dynamic learning. Thus, if applicable, the parameters may be combined to one another on the specific level and on the abstract level. Exemplarily, in one situation, the parameter values for a set of parameters may be omitted from the general or abstract frame of a user profile and may be absolutely necessitated for the application in such a situation. Thus, a user may exemplarily favor the speech signal from a mobile phone to be amplified very strongly with an arriving train (or generally with "loud background noises"), whereas a different user under no circumstances wants to listen to very loud signals and consequently would accept not understanding the call.

In one implementation, the system—exemplarily only temporarily—comprises a fourth output device for outputting audio signals, wherein the fourth output device is configured to output audio signals having predeterminable parameter values of a fourth set of settable parameters. In addition, the administration device is configured to determine, starting from the user profile formed, parameter values for the fourth set of parameters of the fourth output device and transfer these to the fourth output device. Starting from this implementation, in a further variation, searching for a suitable set of parameters for the fourth output device will be omitted and the parameter values for the fourth set of parameters for being used in the fourth output device are determined directly using the at least one user profile and then transferred to the fourth output device. Consequently, the fourth output device also is a current output device as is the first output device, wherein, however, the parameter values are determined specifically using the user profiles.

In an alternative variation, searching for sets of parameters may consequently be omitted in the invention by directly operating using the abstract user profiles in order to determine the currently used parameter values when starting from the user profiles.

In a further implementation, the administration device is configured to determiner a user profile for a different user starting from the user profile determined for the user. In one implementation, the user profile for the other user is restricted to the parameter values for a set of parameters. In one implementation, applying transmitting listening preferences is comparing the parameter values of different users to one another and, in the case of a resulting similar user profile, using the parameter values of a user with an output device and/or in an environmental condition for another user. This assumes that otherwise both users would have predetermined comparable parameter values under at least similar or equal conditions.

In one implementation, it is provided for the data storage to be implemented to be cloud-based. This means that the data storage is, at least partly, realized using a cloud. This implementation emphasizes all the more that the (central) administration of the data and the application of data are spatially separate.

In one implementation, the data storage which in the form of a cloud is easier accessible, for example, allows a plurality of users to change and, advantageously improve the stored parameter values and/or user profiles generated and/or algorithms for determining parameter values.

In addition, the object of the invention is achieved by a method for outputting audio signals using an output device, wherein the method comprises at least the following steps: searching for a set of parameter values for a set of parameters which equals or is similar to a set of settable parameters of the output device, in case parameter values for the set of parameters have been found, transferring the parameter values and/or parameter values determined therefrom to the output device, and outputting the audio signals using the output device while applying the transferred parameter values.

The above expositions relating to the system or implementations and discussions thereof correspondingly also apply to the method and the implementations of the method may be realized by corresponding device variations so that the expositions relating to the method correspondingly apply to the system.

Additionally, the invention relates to a computer program having program code for performing the method in accordance with any of the above claims or implementations when starting from the expositions relating to the system.

Furthermore, the invention achieves the object by a setting device for setting predeterminable parameter values of a first set of settable parameters of an output device for outputting audio signals having the predeterminable parameter values. Thus, the setting device comprises at least one data storage for storing parameter values and at least one administration device. The administration device is configured to access the data storage. In addition, the administration device is configured to search the data storage for stored parameter values for a set of parameters which equals the first set of parameters or is similar to the first set of parameters. Finally, the administration device is configured to transfer, in case the administration device has found stored parameter values for the set of parameters in the data storage, the stored parameter values for the set of parameters and/or parameter values determined from this to the first output device. Determining the parameter values in one implementation is directly transferring to an output device and, in an alternative or additional implementation, is calculating or generally determining (like by accessing a data table) the currently used parameter values.

The above expositions relating to the system and implementations and discussions thereof correspondingly also apply to the setting device as part of such a system. The setting device and at least one output device can particularly be combined to form the above system so that the corresponding implementations and expositions relating to the system apply to the setting device as well.

BRIEF DESCRIPTION OF THE DRAWINGS

Embodiment of the present invention will be detailed subsequently referring to the appended drawings, in which.

DETAILED DESCRIPTION OF THE INVENTION

Figure 1:
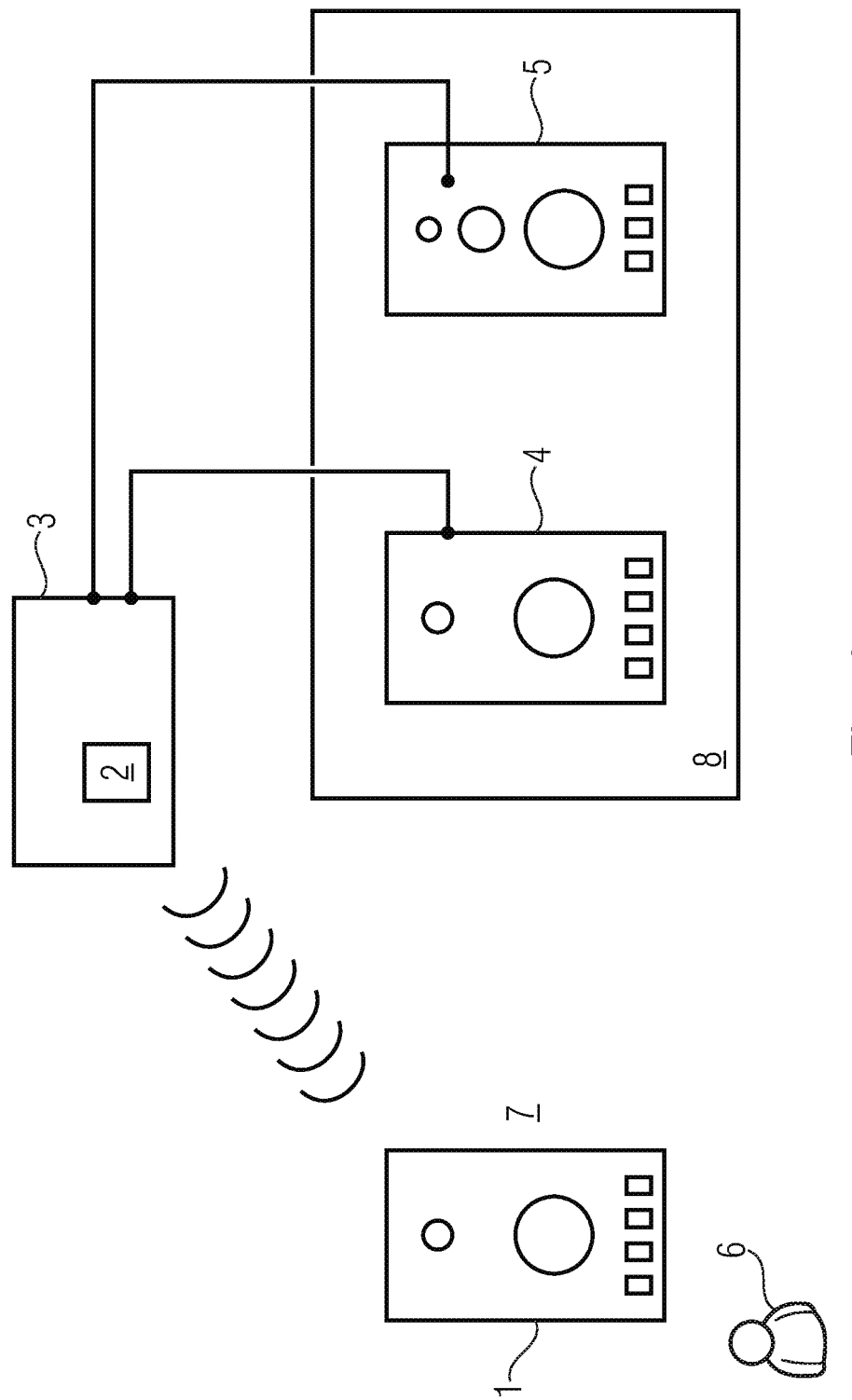
FIG. 1 schematically shows a system for outputting audio signals in a first implementation.

FIG. 1 schematically shows an exemplary system for outputting audio signals.

The first output device 1 here is represented by a loudspeaker which exemplarily is to comprise four switches for presetting parameter values of four parameters. Thus, the four parameters form the first set of settable parameters.

Different parameter values for different sets of parameters are stored in a data storage 2, which in this case is part of an administration device 3. The central data storage 2 allows operating or setting different output devices arranged in a distributed manner. Thus, the output devices may differ in their specific implementation—i.e. relating to their hardware—or relating to the application operated on the same apparatus which makes the same apparatus form different devices. Exemplarily, a computer may be used for reproducing music or performing video communications, the result being respective different output devices.

In the example shown, the administration device 3 is configured to search the data storage 2 for a stored set of parameters which matches the first set of parameters of the first output device 1. "Match" here means that the set found (i.e. the stored and, thus, historic set) equals the first set (i.e. the set to be filled with parameter values and the current one) or the set found is similar to the first set. The similarity may be that the sets relate to similar terminal devices and/or that the sets belong to the same user or listener and/or to similar audio signals (i.e., for example, pure speech or classical music) and/or that a plurality of parameters are equal. This means that the similarity is to be defined depending on the case of application.

When the administration device 3 finds a matching set of parameters, it will transfer the respective parameter values—indicated here by radio waves—to the first output device 1 which consequently has matching parameter values available with no direct intervention by the user 6.

In the implementation shown, the sets of parameters and the values thereof originate from a second output device 4 and a third output device 5. Thus, the second output device 4 is to equal the first output device 1 and the third output device 5 is to differ from the first output device 1. The differences here relate to the terminal device (illustrated by two, in contrast to three diaphragms), but also to the number of settable parameters (four parameters in contrast to three parameters). The connection between the administration device 3 and the second 4 and third output devices 5 here is exemplarily realized by means of a cable.

When a user 6 has performed setting of the parameters at the second output device 4 and the third output device 5 (which means that both output devices 4, 5 are historic output devices relative to the first, current output device 1), this means that these parameter values will automatically also be available at the first output device 1. The parameter values here can either be used directly (here from the second output device 4) or result from an adaptation from the stored, historic parameter values (here from the third output device 5).

When the user subsequently changes the parameter values at the first output device 1, they will be accepted and stored in the data storage 2. The different parameter values in this example can be attributed to the fact that the first output device 1 is in a free environmental situation 7, whereas the second output device 4 and the third output device 5 are arranged in a closed environmental situation 8—which is indicated here by the box.

Figure 2:
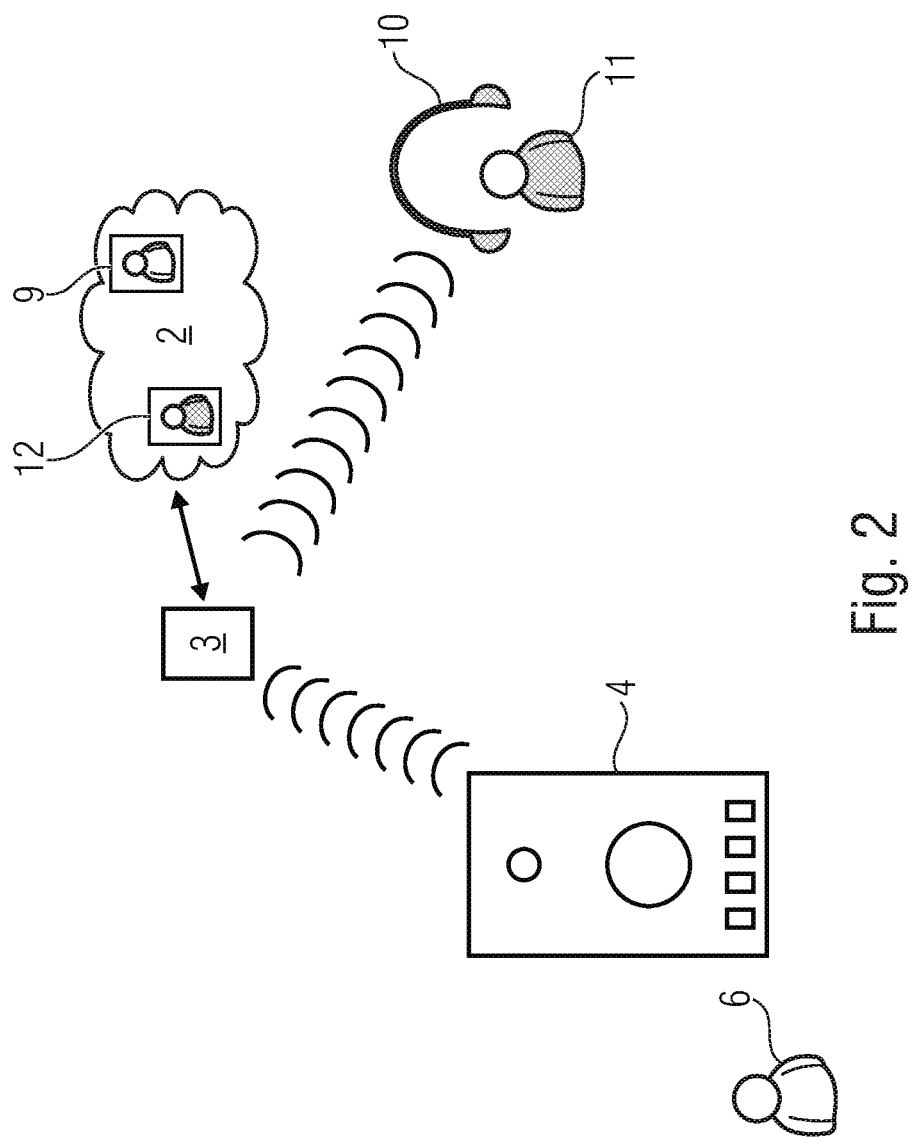
FIG. 2 schematically shows a system in a second implementation.

FIG. 2 illustrates a system where the user 6 predetermines at the second output device 4 the parameter values for the second set of parameters which comprises four parameters. These parameter values are radio-transmitted to the administration device 3 and stored in the data storage 2 which in this case is realized in a cloud. Additionally, the administration device 3 generates from the parameter values a user profile 9 for the user 6 which is also stored in the data storage 2.

The administration device 3 uses the stored user profile 9 in order to determine from this the parameter values for a fourth output device 10 and another user 11 (or generally a user). This means that the one parameters relate to a loudspeaker (second output device 4) and the other parameters to a headset (fourth output device 10). For this purpose, the parameter values relating to the volume are, for example, scaled down correspondingly.

In addition, the parameter values are also recalculated for another user 11. For the recalculation, the user profile 9 of the one user 6 stored in the data storage 2 and the user profile 12 of the other user 11 are compared to each other so as to allow matching of the parameter values.

Figure 3:
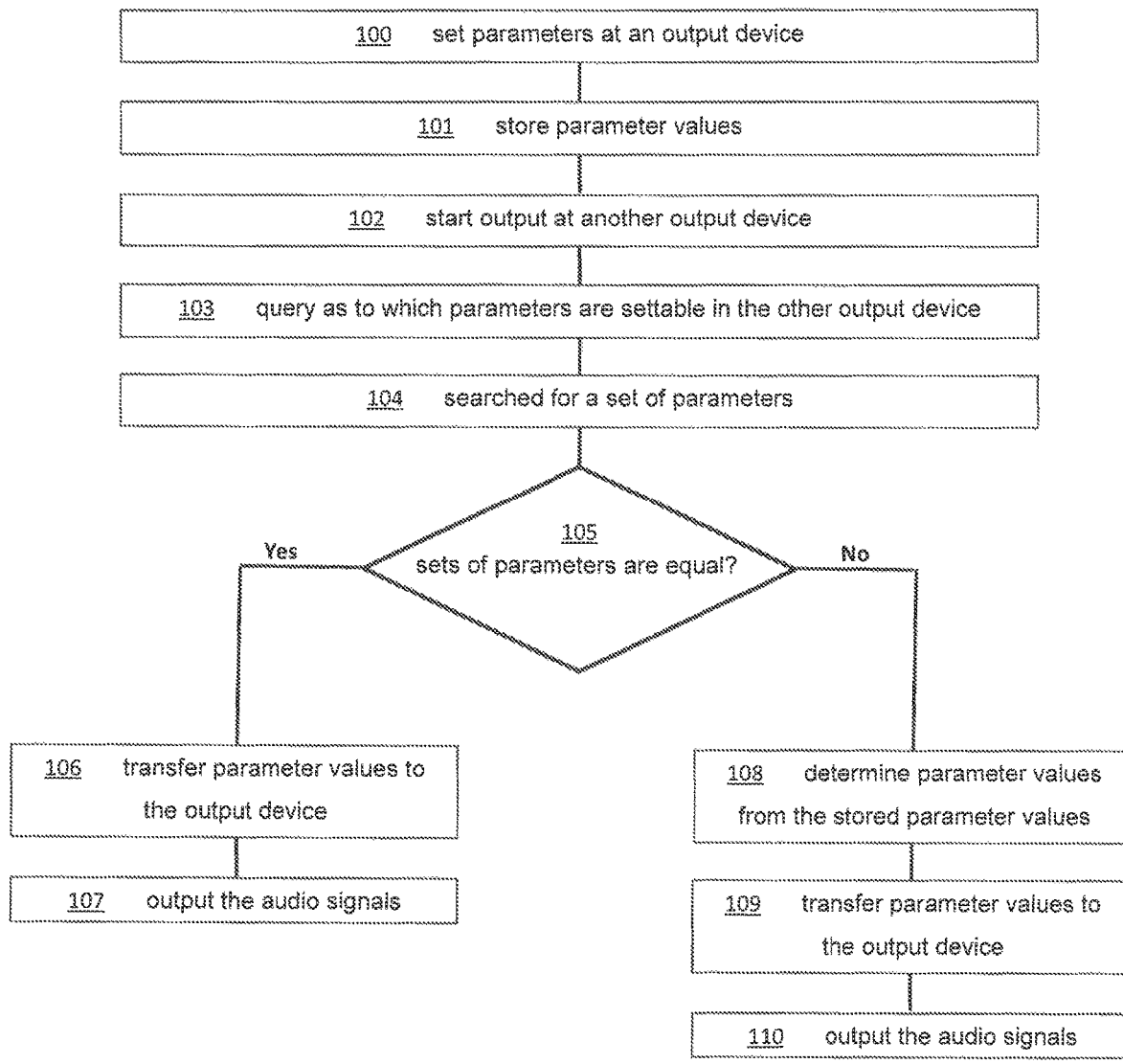
FIG. 3 shows a flowchart of an example of the method.

FIG. 3 shows a schematic flow of the inventive method.

In step 100, a user sets the parameters at an output device (referred to above as second output device above) such that the optimum sound for him or her will result. The parameter values here are specific for him or her as a user, but also for the output device or for the type which the output device belong to, and for the given environmental or listening situation.

The parameter values are stored in step 101.

The user now wants audio signals to be output using another output device, which he or she starts the output for in step 102.

In step 103, a query as to which parameters are settable in the other output device is performed. This means that it is determined which one is the used set of parameters in this case.

Subsequently, in step 104, the quantity of data stored is searched for a set of parameters which is equal or similar to the used set of parameters.

Depending on what set of parameters is found, different steps will follow after step 105.

When the same set of parameters has been found, in step 106, the respective parameter values are transferred to the output device and, in step 107, the output device outputs the audio signals having the suitable parameter values.

When the sets of parameters are not equal, in step 108, the used parameter values are determined from the stored parameter values. Thus, with equal parameters, for example, the parameter values are accepted and, with mutually deviating parameters, approximation methods are used for calculating or determining. When, for example, there are settings for two frequency ranges only, but settings of three frequency ranges are used, the settings, i.e. parameter values, for the missing frequency range are determined by extrapolation or interpolation.

In step 109, the parameter values determined are transferred to the output device where they are used, in step 110, for outputting the audio signals.

All in all, depending on the implementation, the invention allows transmitting parameter values between different output devices, but also between different users/listeners or groups of listeners. The historic parameters here are gained from the settings at output devices and can also be stored directly as pure data (like an audiogram, for example). The currently used parameter values are either taken from the stored parameter values in an unchanged manner or are determined from the stored data or by using user profiles generated. In particular, an adaptation to the potentials of the current output device is done with the historic data material present. Alternatively or additionally to user profiles, profiles for output devices or types of output devices and/or for environmental situations are also generated.

Thus, the invention allows transmitting and/or applying the respective personal sound preference to the respective current audio situation. In addition, the parameter values may also be related to the respective kind of audio signals or the audio signals themselves and differ from one another in this respect. When, for example, the audio signals are jazz music, the parameter values may differ from those when reproducing a piano piece by J. S. Bach. In another example, when reproducing speech, a user favors much treble, because he or she is impaired when hearing high sounds and consequently can understand better in this way. In the case of music as the other audio signal type, he or she will emphasize bass sound for reasons of personal taste. This means that a PodCast app, for example, would have different parameter values transferred to it than a music player app.

The output devices generally refer to apparatuses (TV, cell phone, computer, stereo set, hearing aid, etc.) or to the respective application to be performed (reproducing music, telephony, reproducing/replaying movies, etc.) and corresponding software solutions likes PodCast players, VoiceOverIP-telephony apps, etc.

In addition, the administration device is able to learn in order to improve the algorithms used by it and adapt same to the requirements. In one implementation, the administration device automatically adapts the user profiles to any further default of parameter values.

Functional features having been described referring to a device, also represent—as will be obvious for those skilled in the art—features of a corresponding method configured to provide a corresponding functionality. Conversely, features having been discussed for a method also represent features of a corresponding device configured to execute corresponding features.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A system for outputting audio signals,
comprising a first output device of a plurality of output devices for outputting audio signals,
wherein, for the outputting, the first output device comprises several settable parameters, which all together form a first set of settable parameters,
wherein the first output device is configured to output audio signals comprising predeterminable parameter values of the first set of settable parameters,
comprising at least one data storage for storing parameter values, and
comprising at least one administration device,
wherein the administration device is configured to access the data storage,
wherein the administration device is configured to search the data storage for stored parameter values for a set of parameters which equals the first set of parameters or is similar to the first set of parameters,
wherein the administration device is configured to search the data storage for the stored parameter values for the set of parameters depending on a user associated to the first output device by
comparing stored parameter values for sets of parameters, which are associated to the user, but which are associated to other output devices of the plurality of output devices being different from the first output device, to stored parameter values for sets of parameters, which are associated to other users being different from the user, and associated to the same other output devices of the plurality of output devices being different from the first output device, and selecting from the data storage stored parameter values, which stored parameter values are associated to a same output device type as the first output device, and are associated to a user, for which user the comparison results in the greatest similarity, and wherein the administration device is configured such that, in case the administration device has found stored parameter values for the set of parameters in the data storage, the administration device transfers the stored parameter values for the set of parameters and/or parameter values determined therefrom to the first output device.

2. The system in accordance with claim 1,
wherein:
the system comprises a second output device for outputting audio signals,
the second audio device is configured to output signals comprising predeterminable parameter values of a second set of settable parameters, and
the administration device is configured to store, after predetermining the parameter values of the second set of parameters such that the predeterminable parameter values of the second set of settable parameters are set to set parameters, at least the set parameter values of the second set of parameters in the data storage.

3. The system in accordance with claim 1,
wherein:
the administration device is configured to store the set parameter values in the data storage in a manner associated to a type of the second output device and/or a user and/or an environmental situation and/or the audio signals to be output and/or a type of the audio signals to be output.

4. The system in accordance with claim 1,
wherein:
the administration device is configured to take into consideration, when searching the data storage for the stored parameter values for the set of parameters, a current environmental situation at the first output device by the administration device favoring stored parameter values for sets of parameters which are associated to environmental situations similar to the current environmental situation.

5. The system in accordance with claim 1,
wherein:
the administration device is configured to take into consideration, when searching the data storage for the stored parameter values for the set of parameters, the audio signals to be output by the administration device favoring stored parameter values for sets of parameters which are associated to audio signals similar to the audio signals to be output.

6. The system in accordance with claim 1,
wherein:
the administration device is configured to form a user profile for the user starting from the parameter values associated to a user and stored in the data storage.

7. The system in accordance with claim 6,
wherein:
there is a fourth output device for outputting audio signals,
wherein the fourth output device is configured to output audio signals comprising predeterminable parameter values of a fourth set of settable parameters, and
wherein the administration device is configured to determine, starting from the user profile formed, parameter values for the fourth set of parameters and transfer same to the fourth output device.

8. The system in accordance with claim 6,
wherein:
the administration device is configured to determine a user profile for another user starting from the user profile formed for the user.

9. The system in accordance with claim 1,
wherein:
the data storage is implemented to be cloud-based.

10. A method for outputting audio signals comprising predeterminable parameter values of a first set of settable parameters using a first output device of a plurality of output devices,
wherein, for the outputting, the first output device comprises several settable parameters, which all together form the first set of settable parameters,
wherein a data storage is searched for a set of stored parameter values for a set of parameters which is equal or similar to the first set of settable parameters of the first output device,
wherein searching the data storage for the set of stored parameter values is conducted depending on a user associated to the first output device by
comparing stored parameter values for sets of parameters, which are associated to the user, but which are associated to other output devices of the plurality of output devices being different from the first output device, to stored parameter values for sets of parameters, which are associated to other users being different from the user, and associated to the same other output devices of the plurality of output devices being different from the first output device, and
selecting from the data storage stored parameter values, which stored parameter values are associated to a same output device type as the first output device, and are associated to a user, for which user the comparison results in the greatest similarity, and
wherein, in case parameter values for the set of parameters have been found, the parameter values and/or parameter values determined therefrom are transferred to the first output device, and
wherein the audio signals are output using the first output device while applying the transferred parameter values.

* * * * *